United States Patent [19]
Shindo

[11] Patent Number: 5,978,246
[45] Date of Patent: Nov. 2, 1999

[54] CONTENT ADDRESSABLE MEMORY DEVICE

[75] Inventor: Takeshi Shindo, Tokyo, Japan

[73] Assignee: NEC Corporation, Tokyo, Japan

[21] Appl. No.: 09/149,439

[22] Filed: Sep. 8, 1998

[30] Foreign Application Priority Data

Sep. 8, 1997 [JP] Japan .................................... 9-242592

[51] Int. Cl.⁶ .................................................. G11C 15/00
[52] U.S. Cl. .................. 365/49; 365/189.07; 365/230.03
[58] Field of Search ............................... 365/49, 189.07, 365/205, 230.03

[56] References Cited

U.S. PATENT DOCUMENTS 5,491,703  2/1996  Barnaby et al. ...................... 365/49 X
5,592,407  1/1997  Konishi et al. ................. 365/230.03 X
5,642,320  6/1997  Jang ................................ 365/189.07 X

FOREIGN PATENT DOCUMENTS

62-293596  12/1987  Japan .
2-192098    7/1990  Japan .
6-89588     3/1994  Japan .

*Primary Examiner*—Huan Hoang
*Attorney, Agent, or Firm*—Young & Thompson

[57] ABSTRACT

It is an object of the invention provide a content addressable memory, which operates at high speed and consumes low electrical power. The first CAM cell array, which is supplied with higher m bits of reference data, is composed of m CAM cells connected in series for each word, compares previously stored data of m bits with higher m bits of reference data in bit serial for each word. The first sense amplifier detects the result of comparison. The second CAM cell array, which is supplied with lower n-m bits of the reference data, is composed of n-m CAM cells connected in parallel for each word, made to be in operating condition only in case that the output of the first sense amplifier shows coincidence, and compares previously stored data of n-m bits with lower n-m bits of the reference data in bit parallel for each word. The second sense amplifier detects the result of comparison.

5 Claims, 6 Drawing Sheets

CONTENT ADDRESSABLE MEMORY DEVICE

FIELD OF THE INVENTION

The invention relates to a content addressable memory device.

BACKGROUND OF THE INVENTION

As well known to all, an ordinary memory device reads or writes into an assigned address, but a content addressable memory device is supplied with reference data and outputs information on the existence of data, which is the same as or similar to the reference data, other data stored in a word containing the reference data and the addresses of the data, in addition to function of the ordinary memory device. Accordingly, the content addressable memory device is called an associative memory device also.

The content addressable memory (CAM) is composed of plural CAM cells, and each of the CAM cells is provided with a memory circuit of one bit and a comparator for comparing one bit stored in the memory circuit with a datum of one bit supplied thereto. The comparator circuit is composed of plural N-channel MOSFETs.

In the CAM, since reference is made to the content stored in the memory circuits, the CAM cells constituting the CAM have access to all the address, which is distinct from the RAM having access only to the assigned address. Accordingly, all the signal lines are activated, and high electrical power is consumed.

Hitherto, the content addressable memory device of various kind for reducing consumed electrical power have been proposed. For example, a content addressable memory cell device composed of CAM cells, each of which has a common line serving as both a bit line of a RAM and a reference signal line of a CAM and is provided with a coincidence signal line for outputting the result of comparison and a coincidence detection control signal line for controlling the coincidence signal line, is disclosed in Japanese patent Kokai 2-192098 (a conventional technologyl, hereinafter). Inthis technology, the potential of the coincidence detection control signal line is made to be a low logical level only at the time of the operation of comparison, and thereby the potential of the coincidence signal line is changed into a low logical level from a high logical level at the time of anticoincidence. Since the potential of the coincidence signal line is not made to be a low logical level at the time of write in a RAM operation, the level of the coincidence signal line is unchanged, even in case that N-channel MOSFETs are in anion condition. Accordingly, electrical energy consumed therein is reduced. The content addressable memory device shown the conventional technology 1 is constituted of a parallel connection of the plural CAM cells.

In Japanese patent Kokai 62-293596, a content addressable memory device, which reduces consumption of electrical power at the time of comparison (the conventional technology 2, hereinafter), is disclosed. The content addressable memory device disclosed in the conventional technology 2, in which one word is composed of n bits, comprises a decoder for selecting a word in order to wire a data of n bits, the first CAM cell array, in which one word is composed of m bits, the first sense amplifier for detecting the result of comparison of the fist CAM cell array, the second CAM cell array, which carries out the operation of comparison based on the output of the first sense amplifier, one word of the second CAM cell array being n-m bits, and the second sense amplifier, which detects the result of comparison of the second CAM cell array responding to the output of the first sense amplifier.

In the conventional technology 2, the first CAM cell array is constituted of a parallel connection of them CAM cells, and compares the previously stored data of m bits with the higher m bits of the reference data in bit parallel. Similarly, the second CAM cell array is constituted of a parallel connection of the n-m CAM cells, operates only in case that the output of the first sense amplifier shows coincidence, and compares the previously stored data of n-m bits with the lower n-m bits of the reference data in bit parallel.

In such a structure, the second CAM cell carries out the operation of comparison, after the operation of comparison of the first CAM cell array is completed. Accordingly, the second clock signal is necessary for the operation of comparison of the second CAM cell array, in addition to the first clock signal necessary for the operation of comparison of the first CAM cell array.

Moreover, in a technology disclosed in Japanese patent Kokai 6-89588 (the conventional technology 3, hereinafter), a content addressable memory device, in which a timing control signal for generating a coincidence detection signal is unnecessary, and high speed operation becomes possible by adopting AND logical operation circuits with low electric currents consumed therein, is disclosed. In the conventional technology 3, plural CAM cells are connected in series.

On the aforementioned conventional technologies, problems mention in later are pointed out.

In the conventional technology 1, there is a disadvantage that electrical power consumed at the time of comparison is high. The reason is that in case that the result of comparison shows anticoincidence at the time of comparison, the potential of the coincidence signal line and that of the coincidence detection control signal line, which has nearly the same capacity as that of the coincidence signal line, are changed into low logical levels from high logical levels.

In the content addressable memory device disclosed in the conventional technology 2, clock signals of two kinds, the first and second clock signals, are necessary, and it is difficult to adjust the two clock signals to each other. Moreover, since the CAM cells of both the first and second CAM cell arrays respectively operate in parallel, consumed electrical power becomes high.

In the content addressable memory device disclosed in the conventional technology 3, since the plural CAM cells are connected in series, the speed of operation becomes low, as the number of the CAM cells connected in series increases.

SUMMARY OF THE INVENTION

Accordingly, it is an object of the invention to provide a content addressable memory device, which operates at high speed and consumes low electrical power.

According to a feature of the invention, a content addressable memory device comprises:

a first content addressable memory cell (CAM cell, hereinafter) array, which is supplied with higher m ($2 \leq m < n-1$) bits of reference data, constituted of a series connection of m CAM cells for each word, and compares previously stored data of m bits with higher m bits of the reference data in bit serial for each word, a first sense amplifier for detecting a result of comparison of the first CAM cell array, a second CAM cell array, which is supplied with lower n-m bits of the reference data, constituted of a parallel connection of n-m CAM cells for each word, made to be in an operating condition only in case that an output of the first sense amplifier shows coincidence, and compares previously stored data of n-mbits with the lower n-mbits of the reference data in bit parallel for each word, and a second sense amplifier for detecting a result of comparison of the second sense amplifier.

BRIEF DESCRIPTION OF THE DRAWINGS

The invention will be explained in more detail in conjunction with appended drawings, wherein.

DESCRIPTION OF THE PREFERRED EMBODIMENT

Thereafter, a preferred embodiment of the invention will be explained in detail referring to appended drawings.

Figure 1:
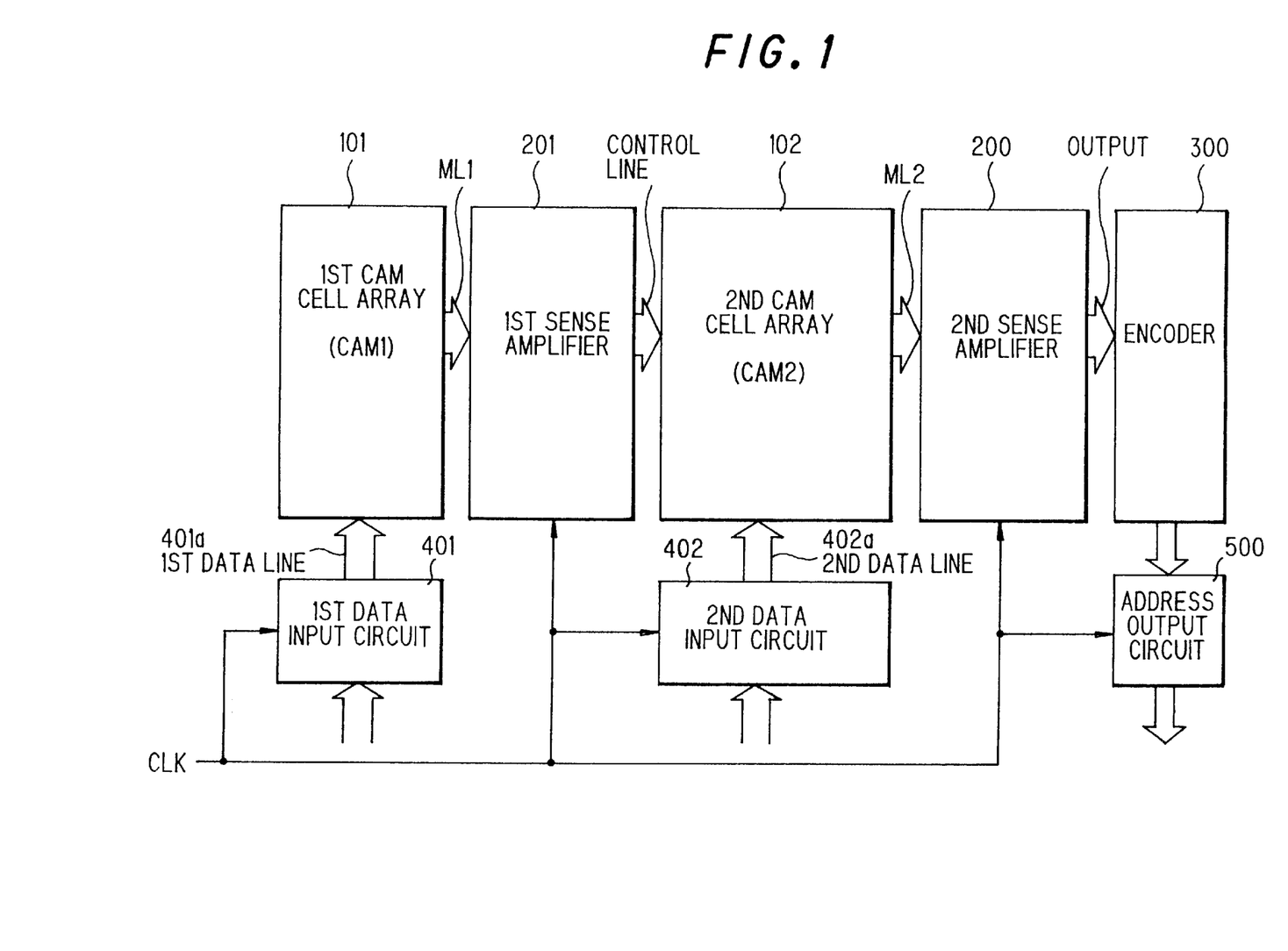
FIG. 1 is a block diagram for showing a structure of a content addressable memory device according to a preferred embodiment of the invention.

FIG. 1 shows a content addressable memory device according to the first preferred embodiment of the invention, in which one word is composed of n bits, where n is an integer 5 or more. The content addressable memory device is composed of the first and second content addressable memory (CAM) cell arrays 101 and 102, the first and second sense amplifiers 201 and 202, an encoder 300, the first and second data input circuits 401 and 402, and an address output circuit 500. A clock signal CLK is supplied to the first and second amplifiers 201 and 202, the first and second data input circuits 401 and 402, and the address output circuit 500.

Higher n bits ($2 \leq m < n-1$) of a reference data composed of n bits is supplied to the first CAM array 101 from the first data input circuit 401 via the first data line 401a. As mentioned later, the first CAM cell array 101 is constituted of a series connection of the m CAM cells for each word, and compares previously stored data of m bits with the higher m bits of the reference data in bit serial for each word. m is advisably 3 or more. The first sense amplifier 201 detects the result of comparison ML1 in the CAM array 101. The second Cam cell array 102 are supplied with the lower n-m bits of the reference data from the second data input circuit 402 via the second data line 402a. As mentioned later, the second CAM cell array 102 is constituted of a parallel connection of n-m CAM cells for each word, is made to operate only when the output of the first sense amplifier 201 shows coincidence, and compares previously stored data of n-m bits with lower n-m bits of the reference data in bit parallel for each word. The second sense amplifier 202 detects the result ML2 of comparison of the second CAM cell array 102. The encoder 300 converts the output of the second sense amplifier 202 into a code. The address output circuit 500 converts the code supplied from the encoder 300 into an address signal and supplies it to the outside.

Figure 2:
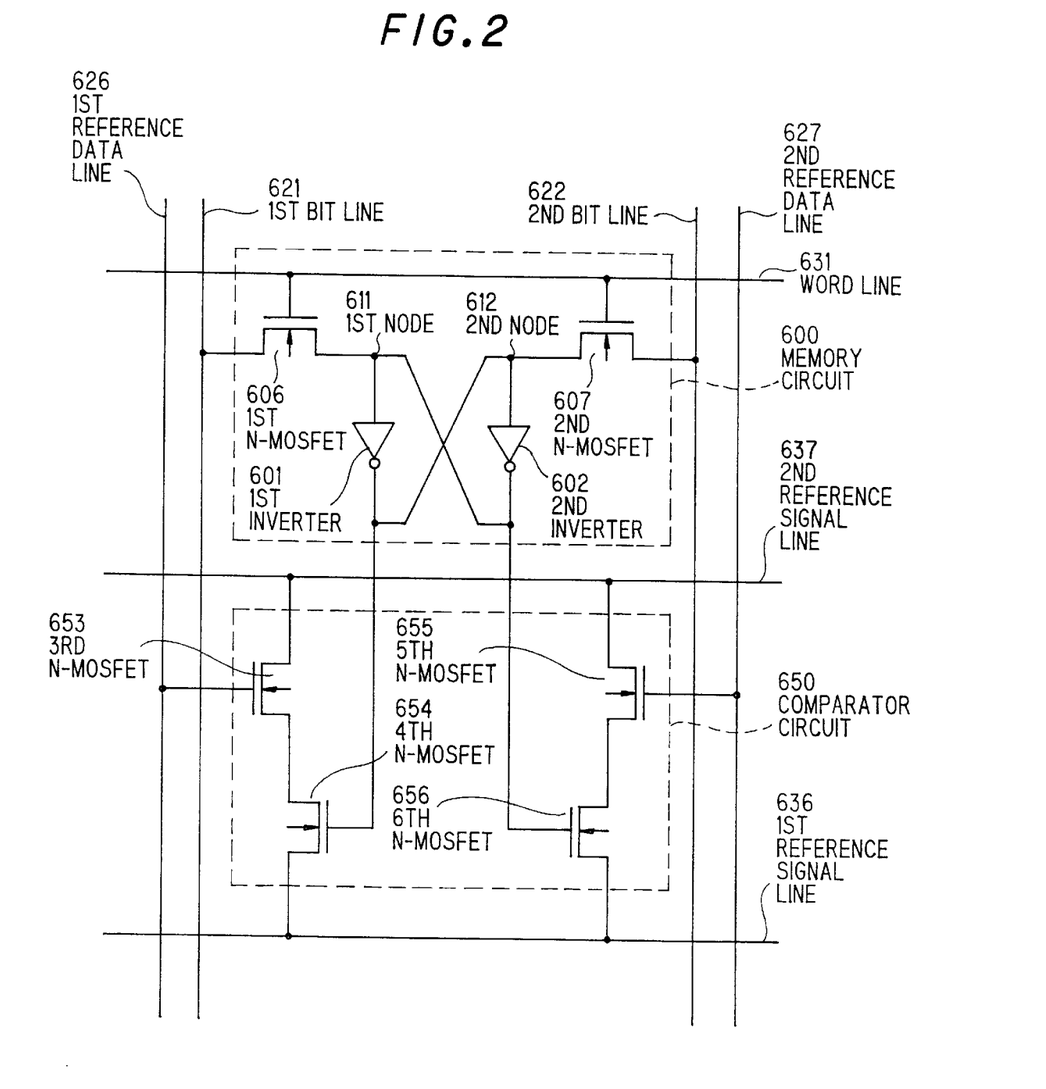
FIG. 2 shows an example of a circuit diagram of a content addressable memory cell, which constitutes a content addressable memory device.

FIG. 2 shows the content addressable memory (CAM) cell used in the first and second CAM cell arrays 101 and 102. The CAM cell is composed of a memory circuit 600 for storing a datum of one bit, and a comparator circuit 650 for comparing one bit of the reference data with one bit of the stored data. The memory circuit 600 is composed of the first and second inverters 601 and 602 and the first and second N-channel MOSFETS 606 and 607. A connection node between the input terminal of the first inverter 601 and the output terminal of the second inverter 602 is called the first node 611, and a connection node between the input terminal of the second inverter 602 and the output terminal of the first inverter 601 is called the second node 612. A datum to be stored is held in the first and second nodes 611 and 612. The comparator circuit 650 is composed of the third to sixth N-channel MOSFETs 653, 654, 655 and 656. In FIG. 2, 621 and 622 are the first and second bit lines, 626 and 627 are first and second reference data lines supplied with the reference data, 631 is a word line for writing into the CAM cell, and 636 and 637 are the first and second reference signal lines.

In the CAM cell show in FIG. 2, bit lines 621 and 622 are separated from the reference data lines 626 and 627.

As well known to all, the MOSFET has the three electrodes, i.e. the gate, drain and source electrodes. Hereinafter, the drain and source electrodes will be called principal electrodes.

In the memory circuit 600, the gates of the first and second N-channel MOSFETs 606 and 607 are connected with the word line 631. One of the principal electrodes of the first N-channel MOSFET 606 is connected with the first bit line 621, and the other one of the principal electrodes is connected with the first node 611. One of the principal electrodes of the second N-channel MOSFET 607 is connected with the second bit line 622, and the other one of the principal electrodes is connected with the second node 612.

In the comparator circuit 650, the gate of the third N-channel MOSFET 653 is connected with the first reference data line 626, and one of the principal electrodes is connected with the second reference signal line 637. The gate of the fourth N-channel MOSFET 654 is connected with the second node 612, and one of the principal electrodes is connected with the first reference signal line 636. The other ones of the principal electrodes of the third and fourth N-channel MOSFRTs 653 and 654 are connected with each other. Similarly, the gate of the fifth MOSFET 655 is connected with the second reference data line 627, and one of the principal electrodes is connected with the second reference signal line 637. The gate of the sixth N-channel MOSFET 656 is connected with the first node 611, and one of the principal electrodes is connected with the first reference signal line 636. The other ones of the principal electrodes of the fifth and sixth N-channel MOSFETs 655 and 656 are connected with each other.

FIGS. 3 to 6 respectively show the circuit diagrams of the first and second CAM cell arrays 101 and 102 shown in FIGS. 1 and 2 for constituting the content addressable memory device, and the first and second sense amplifiers 201 and 202, each being constituted for data of one word.

Reference numerals of the respective CAM cells are provided with suffixes for convenience of distinction.

Figure 3:
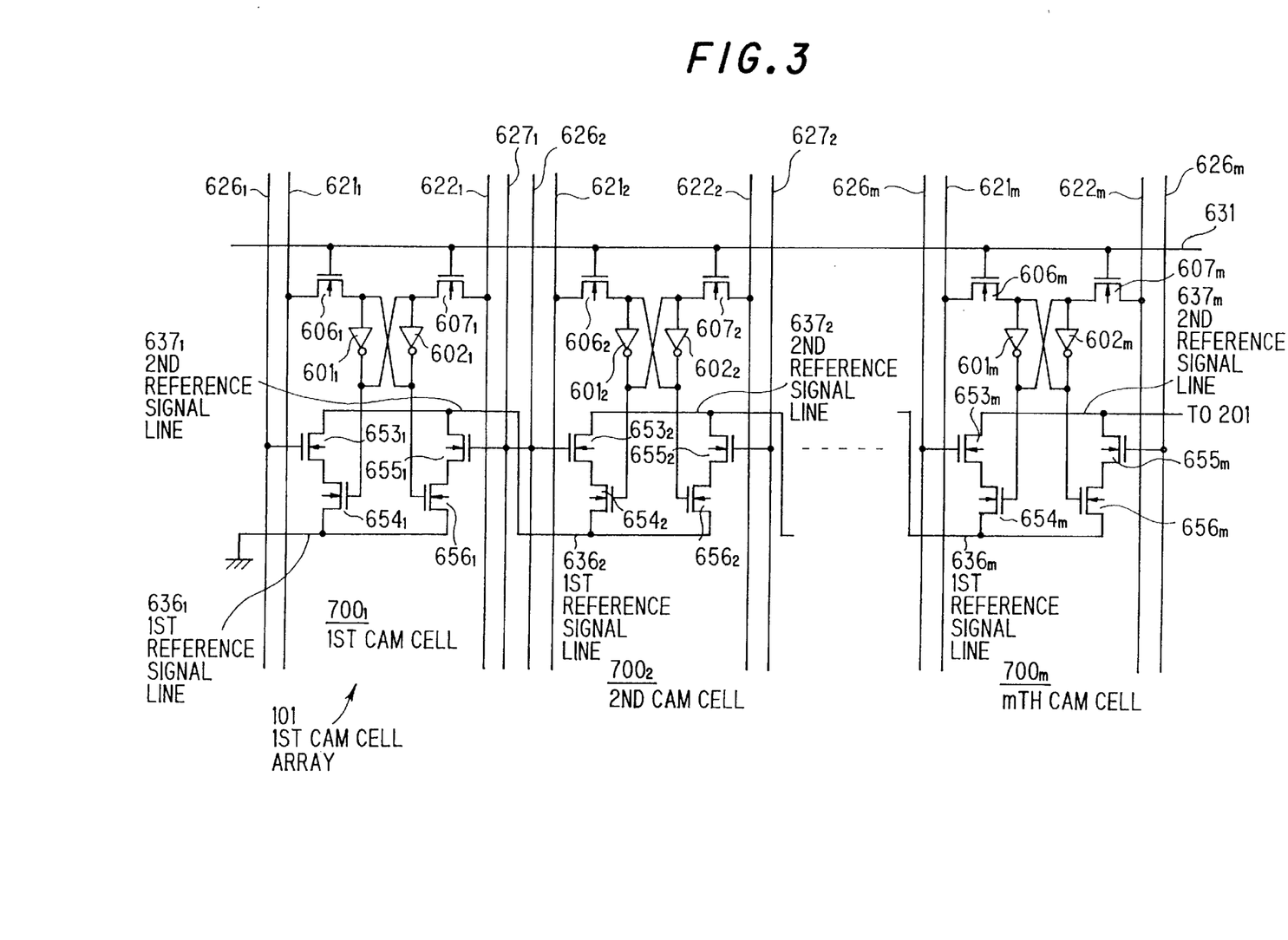
FIG. 3 shows a circuit diagram for concretely showing a structure of the first CAM cell array for one word, which is used in a content addressable memory device.

As shown in FIG. 3, the first CAM cell array 101 is constituted by connecting the CAM cells $700_1$ to $700_m$ in series. m is 4 for instance. As shown in FIG. 3, the first reference signal line $636_1$ of the first CAM cell $700_1$ is grounded, and the second reference signal line $637_1$ of the first CAM cell $700_1$ is connected with the first reference signal line $636_2$ of the second CAM cell array $700_2$. Similarly, the second reference signal line $637_2$ of the second Cam cell $700_2$ is connected with the first reference signal line (not shown) of the third CAM cell (not shown) The second reference signal line (not shown) of the m−1 th CAM cell (not shown) is connected with the first reference signal line $636_m$ of the m th CAM cell $700_m$. The second reference signal line $637_m$ of the m th CAM cell array $700_m$ is connected with the first sense amplifier 201 mentioned later.

Figure 4:
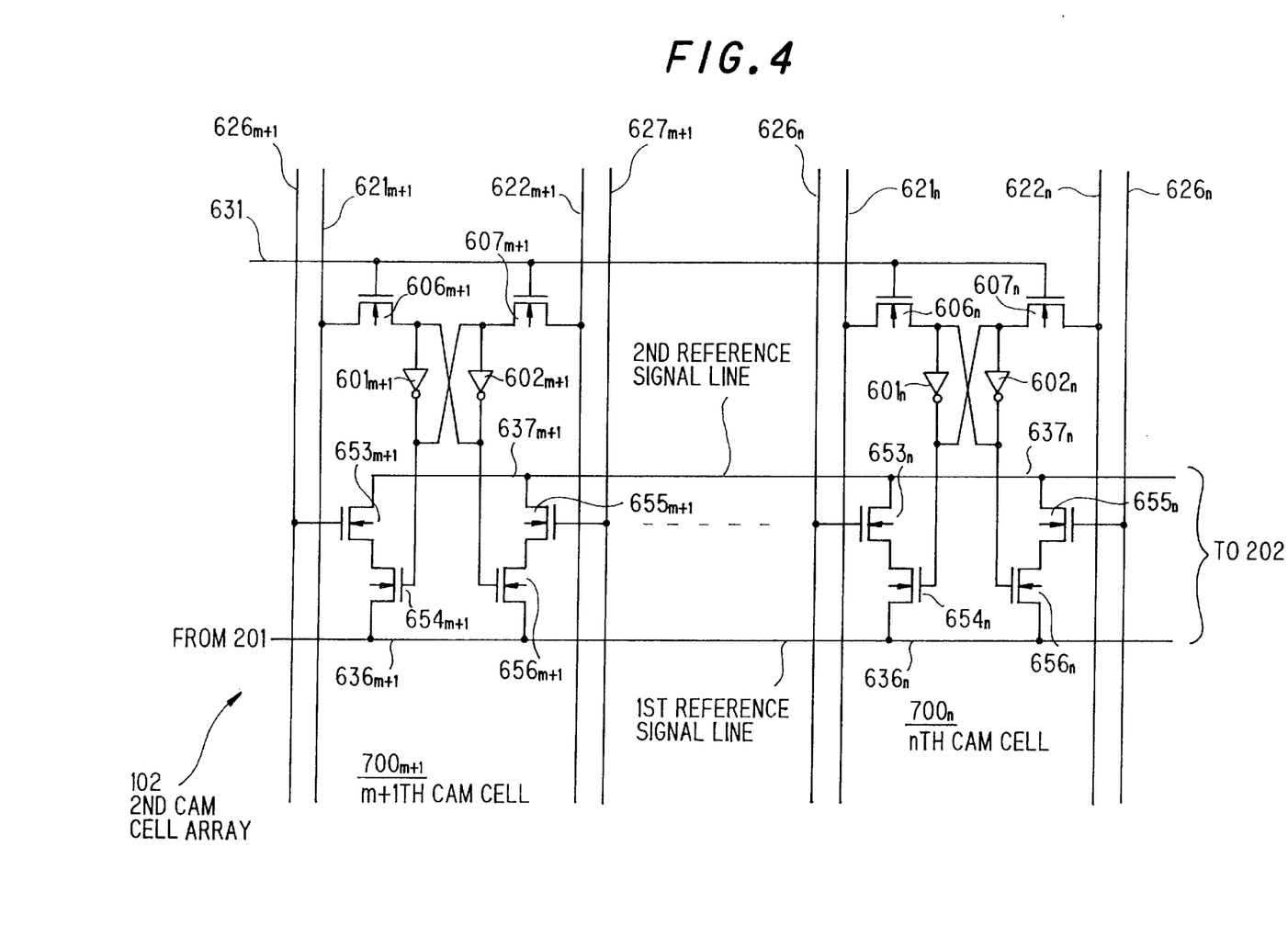
FIG. 4 shows a circuit diagram for concretely showing a structure of the second CAM cell array for one word, which is used in a content addressable memory device.

As shown in FIG. 4, the second CAM array 102 is constituted by connecting the m+1 th to n th CAM cells $700_{m+1}$ to $700_n$ in parallel, n-m is 32 for instance. As shown in FIG. 4, the first reference signal line $636_{m+1}$ to $363_n$ of the CAM cells $700_{m+1}$ to $700_n$ are connected with each other, and the second reference signal line $637_{m+1}$ to $637_n$ are connected with each other. The first reference signal line $636_{m+1}$ of the m+1 th CAM cell $700_{m+1}$ is connected with the first sense amplifier 201 mentioned in later, and the first and the second reference signal lines $636_n$ and $637_n$ are connected with the second sense amplifier 202 mentioned in later.

Figure 5:
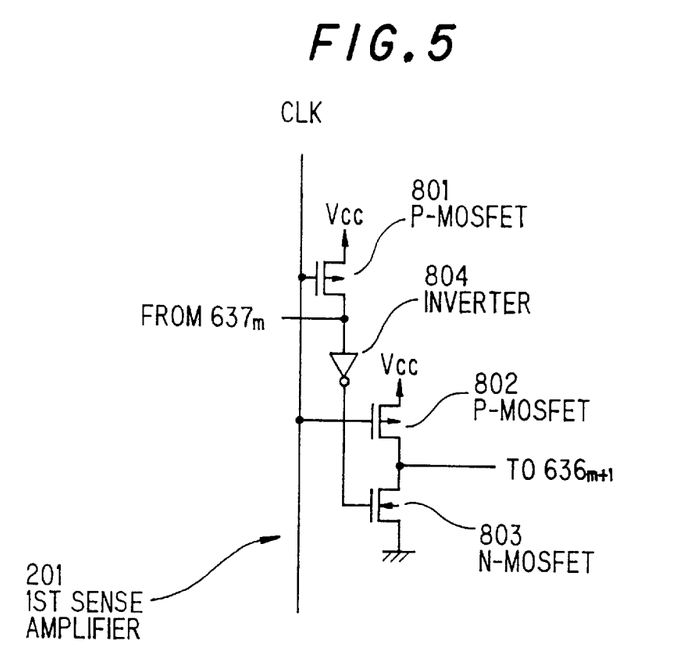
FIG. 5 shows a circuit diagram for concretely showing a structure of the first sense amplifier for one word, which is used in a content addressable memory device.

As shown in FIG. 5, the fist sense amplifier 201 is composed of P-channel MOSEFTs 801 and 802, a N-channel MOSFET 803 and the inverter 804. The clock signal CLK is supplied to the gates of the P-channel MOSFETs 801 and 802, and a positive power supply voltage Vcc is supplied to the sources of them. The drain of the P-channel MOSFET 801 is connected with the second reference signal line $637_m$ (FIG. 3) of the m th CAM cell $700_m$ and the input terminal of the inverter 804. The drain of the P-channel MOSFET 802 is connected with the first reference signal line $636_{m+1}$ (FIG. 4) of the m+1 th CAM cell $700_{m+1}$ and the drain of the N-channel MOSFET 803. The gate of the N-channel MOSFET 803 is connected with the output terminal of the inverter 804, and the source is grounded.

Figure 6:
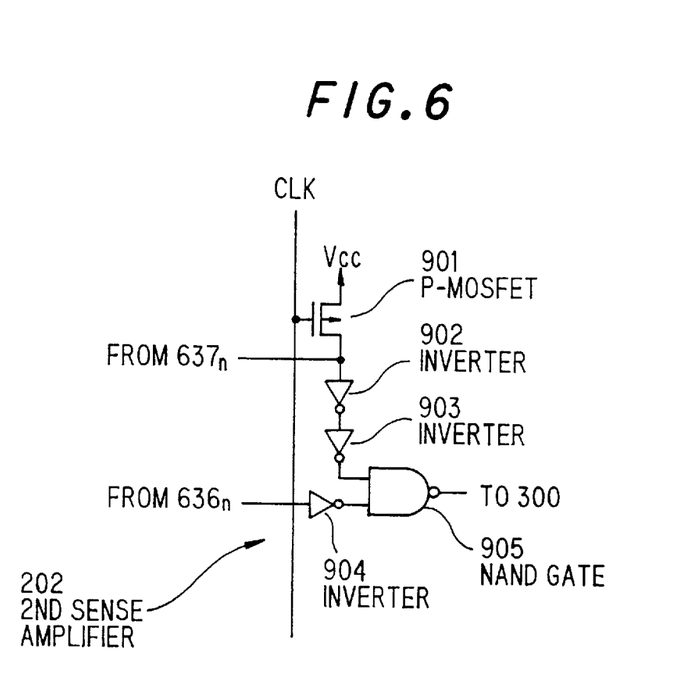
FIG. 6 shows a circuit diagram for concretely showing a structure of the first sense amplifier for one word, which is used in a content addressable memory cell

As shown in FIG. 6, the second sense amplifier 202 is composed of a P-channel MOSFET 901, inverters 902, 903 and 904, and a NAND gate 905. The clock signal CKL is supplied to the gate of the P-channel MOSFET 901, and the positive power supply voltage Vcc is supplied to the source therof. The drain of the P-channel MOSFET 901 is connected with the second reference signal line $637_n$ (FIG. 4) of the n th CAM cell $700_n$ and the input terminal of the inverter 902. The output terminal of the inverter 902 is connected with the input terminal of the inverter 903, and the output terminal of the inverter 903 is connected with one of the input terminals of the NAND gate 905. The input terminal of the inverter 904 is connected with the first reference signal line $636_n$ of the n th CAM cell $700_n$, and the output terminal of the inverter 904 is connected with the other input terminal of the NAND gate 905. The output terminal of the NAND gate 905 is connected with the encoder 300 (FIG. 1).

In the content addressable memory device with the aforementioned structure, each of the CAM cells $700_1$ to $700_m$ in the first CAM cell array detects the coincidence of a bit stored therein and a corresponding bit of the reference data. In other, words, the characteristic of the first CAM cell array 101 is similar to that of the AND logical operation circuit. On the other hand, each of the CAM cells $700_{m+1}$ to $700_n$ in the second CAM cell array 102 detects anticoincidence of a bit stored therein and a corresponding bit of the reference data. In other words, the characteristic of the second CAM cell array is similar to that of the OR logical operation circuit.

Explaining in more detail, at first, the CAM cell array 101 compares the m bits previously stored therein with the higher m bits of the reference data supplied from the first data input circuit 401 in bit serial.

Suppose that m bits stored in the CAM cell array 101 coincide with higher m bits of the reference data. At first, the CAM cell $700_1$ compares the highest bit of the stored data with that of the reference data. Since they coincide with each other, a low logical level is applied to the second reference signal line $637_1$. Since the low logical level is applied to the first reference signal line $636_2$ of the second CAM cell $700_2$, the CAM cell $700_2$ is made to be enable and starts the operation of comparison. The CAM cell $700_2$ compares the second highest bit of the stored data with that of the reference data. Since they coincide with each other, a low logical level is applied to the second reference signal line $637_2$ of the CAM cell $700_2$. Then, the third CAM cell (not shown) is made to be enable and starts the operation of comparison. After the aforementioned operations are repeated, the m th CAM cell $700_m$ is made to be enable at last, and starts the operation of comparison. The CAM cell $700_m$ compares the m th bit, counting from the highest bit, of the stored data with that of the reference data. Since they coincide with each other, a low logical level is applied to the second reference signal line $637_m$ of the CAM cell $700_m$. As mentioned in the above, the first CAM cell array 101 composed of the m CAM cells carries out the operation of comparison serially as falling-dominoes.

Accordingly, if one of the m bits of the stored data does not coincide with a corresponding bit of the higher m bits of the reference data, the CAM cell array stops the operation of comparison thereafter. For example, suppose that the second highest bit of the stored data does not coincide with the corresponding bit of the reference data. In such a case, the first Cam cell $700_1$ detects coincidence, but the second CAM cell $700_2$ detects anticoincidence, hence the third to m th Cam cells do not start the operations of comparison. Accordingly, electrical power consumed in the CAM cell array 101 is steeply reduced as compared with that in the conventional CAM cell array, in which data are compared with each other in bit parallel.

In the first CAM cell array 101, if the data of m bits previously stored therein coincide with the higher m bits of the reference data, supplied from the first data input circuit 401, the low logical level is applied to the second reference signal line $637_m$ of the n th CAM cell $700_m$. Consequently, in the first sense amplifier 201, the output of the inverter 804 becomes a high logical level, the N-Channel MOSFET 803 turns on, and a low logical level is applied to the second CAM cell array 102. As mentioned in the above, when all bits coincide with each other in the first CAM cell array 101, the second CAM cell array 102 is made to be enable for the first time.

The second CAM cell array 102 compares the previously stored data of n-m bits with the lower n-m bits of the reference data supplied from the second input circuit 402 in bit parallel.

Suppose that each bit of the previously stored data of n-m bits coincides with a corresponding bit of the lower n-m bits of the reference data. Then, in the m+1 to n th CAM cells $700_{m+1}$ to $700_m$, a low logical level is applied to the first reference signal lines $636_{m+1}$ to $636_n$, and a high logical level is applied to the second reference signal lines $637_{m+1}$ to $637_m$. Consequently, in the second sense amplifier 202, since high logical levels are applied to both the input terminals of the NAND gate 905, the output of the NAND gate 905 is at a low logical level. Then, the second sense amplifier 202 detects that all the corresponding bits coincide with each other.

On the other hand, even in case that one bit of the lower n-m bits of the reference data does not coincide with a corresponding bit of the stored data of n-m bits, the CAM cell, which corresponds to anticoincidence, electrically connects the first and second reference signal lines. Consequently, in the second sense amplifier 202, a high logical level is applied to one of the input terminals of the NAND gate 905, and a low logical level is applied to the other one of the same. Then, the output of the NAND gate 905 is at a high logical level.

Figure 7:
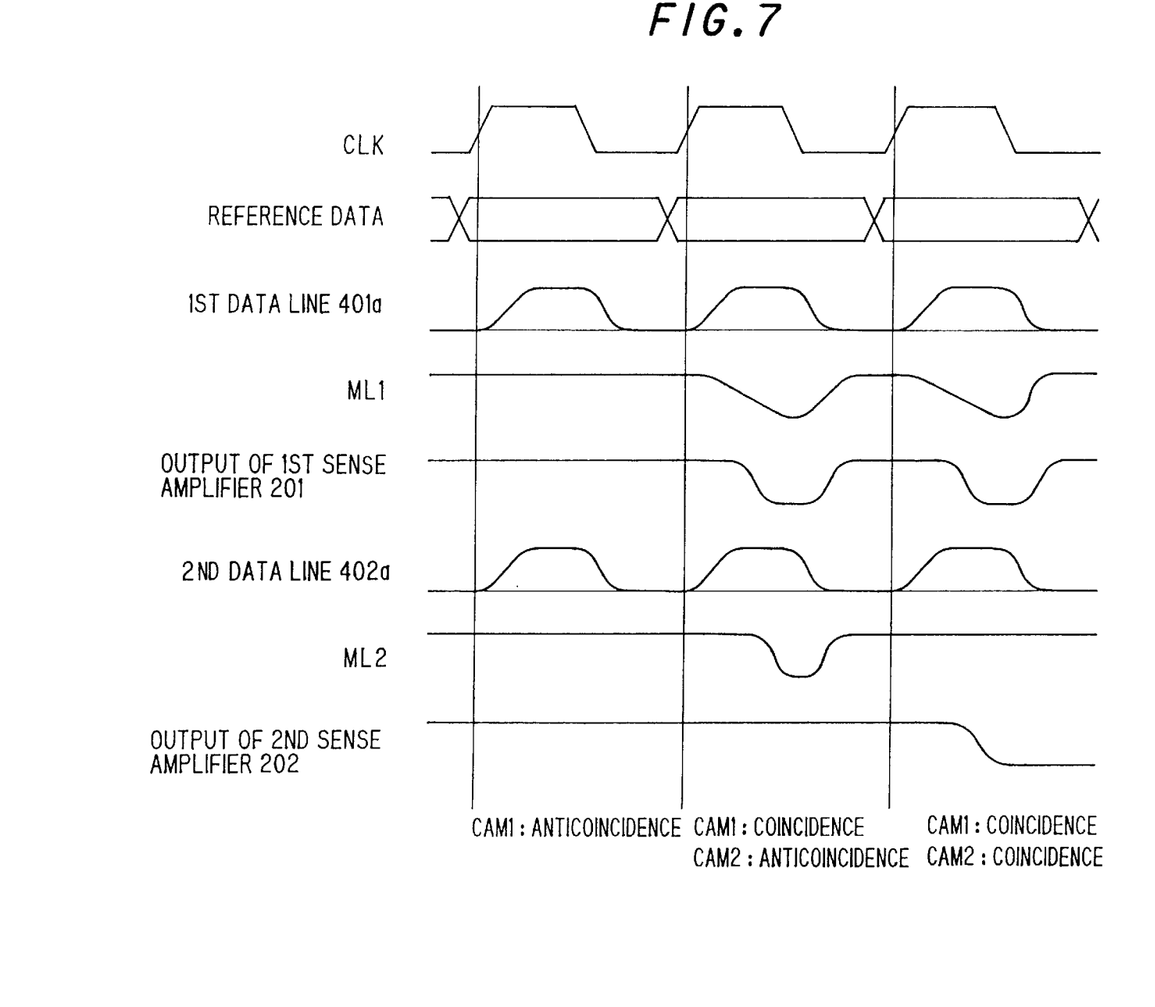
FIG. 7 shows schematic representations of potentials of various parts of a content addressable memory device.

FIG. 7 shows schematic representations of the potentials of the various parts of the content addressable memory device for explaining the operation of the same.

In FIG. 7, the clock signal CLK is shown in the first line, the reference data of n bits is shown in the second line, the data on the first data line $401_a$ is shown in the third line, the result of comparison ML1 of the first CAM cell array (CAM1) 101 is shown in the fourth line, the signal on the control line supplied from the sense amplifier 201 is shown in the fifth line, the data on th second data lien $402_a$ is shown in the sixth line, the result of comparison ML2 of the second CAM cell array (CAM2) 102 is shown in the seventh line, and the output of the second sense amplifier 202 is shown in the eighth line. The first cycle (the first column) of the clock signal CLK shows a case, where the CAM cell array (CAM1) 101 detects anticoincidende. The second cycle (the second clumn) shows a case, where the CAM cell array (CAM1) 101 detects coincidence and the CAM cell array (CAM2) 102 detects anticoincidence. The third cycle (the third column) shows a case, where both the first and second CAM cell arrays 101 and 102 detect coincidence.

In case that the first CAM cell array (CAM1) 101 detects anticoincidence, the result of comparison ML1 is at a high logical level, and a signal of the high logical level is supplied to the control line of the first sense amplifier 201. Consequently, the second CAM cell array (CAM2) 102 does not start the operation of comparison. The second sense amplifier 202 outputs a signal of a high logical level, which represents the anticoincidence of the stored data and the reference data.

In case that the first CAM cell array (CAM1) 101 detects coincidence, the result of comparison ML1 is at a low logical level, and a signal of a low logical level is applied to the control line of the first sense amplifier 201. Consequently, the second CAM cell array (CAM2) 102 starts the operation of comparison. In case that the result of comparison is anticoincideence, the result of comparison ML2 of the second CAM cell array (CAM2) 102 is at a low logical level, which represents anticoincidence. Accordingly, the sense amplifier 202 outputs a high logical level, which represents the anticoincidence of the stored data and the reference data. On the other hand, in case that the result of comparison is coincidence, the result of comparison ML2 of the second CAM cell array (CAM2) 102 is at a high logical level representing coincidence. Then, the sense amplifier 202 outputs a signal of a low logical level, which represents the coincidence of the stored data and the reference data.

Then, mentioned in the above, according to the invention, since the first content addressable memory array is constituted of a series connection of plural content addressable memory cells, and the second memory cell array is constituted of a parallel connection of plural content addressable memory cells, the content addressable memory device, which can operate at the speed and comsues low electrical power, can be presented.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A content addressable memory device, in which one word is composed of n (n is an integer 5 or more) bits, comprising:

a first content addressable memory cell (CAM cell, hereinafter) array, which is supplied with higher m ($2 \leq m < n-1$) bits of reference data, constituted of a series connection of m CAM cells for each word, and compares previously stored data of m bits with higher m bits of said reference data in bit serial for each word, a first sense amplifier for detecting a result of comparison of said first CAM cell array, a second CAM cell array, which is supplied with lower n-m bits of said reference data, constituted of a parallel connection of n-m CAM cells for each word, made to be in an operating condition only in case that an output of said first sense amplifier shows coincidence, and compares previously stored data of n-m bits with said lower n-m bits of said reference data in bit parallel for each word, and a second sense amplifier for detecting a result of comparison of said second sense amplifier.

2. The content appressable memory device as defined in claim 1, wherein said first and second sense amplifiers operate synchonizing with a same clock signal.

3. The content addressable memory cell device as defined in claim 1, wherein:

said m is 3 or more.

4. The content addressable memory device as defined in claim 1, wherein:

a bit line and a reference data line are separated from each other in each of said CAM cells.

5. The content addressable memory device as defined in claim 1, wherein:

each of said CAM cells in said first CAM cell array detects coincidence of a bit stored therein and a corresponding bit of said reference data, and each of said CAM cells in said second CAM cell array detects anticoincidence of a bit stored therein and a corresponding bit of said reference data.

* * * * *